US012701966B2

(12) United States Patent
Huang et al.

(10) Patent No.: US 12,701,966 B2
(45) Date of Patent: Aug. 4, 2026

(54) SEMICONDUCTOR PROCESS DEVICE AND WAFER SUPPORT STRUCTURE THEREOF

(71) Applicant: BEIJING NAURA MICROELECTRONICS EQUIPMENT CO., LTD., Beijing (CN)

(72) Inventors: Shoulin Huang, Beijing (CN); Jun Zhang, Beijing (CN); Jingfeng Wei, Beijing (CN); Qing She, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 317 days.

(21) Appl. No.: 18/696,247

(22) PCT Filed: Sep. 26, 2022

(86) PCT No.: PCT/CN2022/121226
§ 371 (c)(1),
(2) Date: Mar. 27, 2024

(87) PCT Pub. No.: WO2023/051437
PCT Pub. Date: Jun. 4, 2023

(65) Prior Publication Data
US 2025/0046647 A1     Feb. 6, 2025

(30) Foreign Application Priority Data
Sep. 29, 2021    (CN) .......................... 202111151107.2

(51) Int. Cl.
*H10P 72/76*          (2026.01)
(52) U.S. Cl.
CPC ...... *H10P 72/7624* (2026.01); *H10P 72/7612* (2026.01)

(58) Field of Classification Search
CPC .. H10P 72/76; H10P 72/7606; H10P 72/7611; H10P 72/7624; H10P 72/7626;
(Continued)

(56) References Cited

U.S. PATENT DOCUMENTS

2018/0001438 A1* 1/2018 Sakugawa ............. B24B 37/005

FOREIGN PATENT DOCUMENTS

| CN | 104576469 A | 4/2015 |
| CN | 108695228 A | 10/2018 |

(Continued)

OTHER PUBLICATIONS

The World Intellectual Property Organization (WIPO) International Search Report for PCT/CN2022/121226 Dec. 22, 2022 5 Pages (including translation).

*Primary Examiner* — Christopher J. Besler
(74) *Attorney, Agent, or Firm* — ANOVA LAW GROUP, PLLC

(57)          ABSTRACT

A wafer support structure disposed in a loading chamber of a semiconductor process device to support a wafer and drive the wafer to ascend or descend includes: a lifting component, a supporting component, a compressing component, and an adjusting component. The lifting component includes a lifting shaft. A mounting section is provided on the top surface of the lifting shaft. A first end of the supporting component is sleeved in a mounting hole of the mounting section. An inner peripheral wall of the mounting hole and an outer peripheral wall of the mounting section are separated by an adjustment space. A second end of the supporting component is arranged to extend along a radial direction of the lifting shaft. The compressing component is sleeved on an outer periphery of the mounting section and located in the adjustment space. The adjusting component is connected with the support component.

20 Claims, 6 Drawing Sheets

(58) Field of Classification Search
CPC ..... H10P 72/7612; B23Q 3/065; B23Q 3/103;
B23Q 3/105; B23Q 3/18
See application file for complete search history.

(56)     References Cited

FOREIGN PATENT DOCUMENTS

| | | | |
|---|---|---|---|
| CN | 113921455 | A | 1/2022 |
| JP | 2013062431 | A | 4/2013 |

* cited by examiner

SEMICONDUCTOR PROCESS DEVICE AND WAFER SUPPORT STRUCTURE THEREOF

CROSS-REFERENCE TO RELATED APPLICATIONS

This application is a national phase entry of PCT Patent Application No. PCT/CN2022/121226, filed on Sep. 26, 2022, which claims the priority of Chinese Patent Application No. 202111151107.2, filed on Sep. 29, 2021, the entire contents of all of which are incorporated herein by reference.

TECHNICAL FIELD

The present disclosure relates to the technical field of semiconductor processing technology and, more particularly, to a semiconductor process device and a wafer support structure thereof.

BACKGROUND

Currently, in a wafer transfer system, to cool down or transfer a wafer, a wafer support structure is often used. The wafer support structure includes many variations, such as a center beam pin type, a center beam bracket type, and a cantilever beam bracket type, etc.

In the existing technology, the wafer support structure is mostly installed in a loading chamber of a semiconductor process device, and is mainly used to temporarily store the wafer transported by a front-end chamber and to cool the wafer after the process has been completed. Specifically, an atmospheric manipulator places the wafer on the wafer support structure, the loading chamber is evacuated, and then a vacuum manipulator transfers the wafer from the loading chamber to a process chamber for processing. The processes involved include an atomic layer deposition process, a dry cleaning process, and a plasma enhanced atomic layer deposition process, etc. After the wafer completes the process in the process chamber, the vacuum manipulator takes the wafer out of the process chamber and then transfers it to the wafer support structure in the loading chamber that is in a vacuum state. Then the wafer support structure drives the wafer to descend to a cold plate below for cooling. After cooling is completed, the loading chamber returns to an atmospheric state, and then the atmospheric manipulator transfers the wafer out of the loading chamber. It can be seen that the wafer support structure plays an important role at the beginning and ending of the entire process. However, in the existing technology, the wafer support structure is hard to adjust and level due to its problematic structural design, causing problems such as slips or breaks when carrying the wafer. Thus, process yield is substantially affected.

SUMMARY

Regarding the shortcomings in the existing technology, the present disclosure provides a semiconductor process device and a wafer support structure thereof to solve the technical problems in the existing technology of inconvenient adjustment and wafer slips or breaks caused by poor levelness of the wafer support structure.

One aspect of the present disclosure provides a wafer support structure disposed in a loading chamber of a semiconductor process device to support a wafer and drive the wafer to ascend or descend. The wafer support structure includes a lifting component, a supporting component, a compressing component, and an adjusting component. The lifting component includes a lifting shaft. A mounting section is provided on the top surface of the lifting shaft. A first end of the supporting component is sleeved in a mounting hole of the mounting section. An inner peripheral wall of the mounting hole and an outer peripheral wall of the mounting section are separated by an adjustment space. A second end of the supporting component is arranged to extend along a radial direction of the lifting shaft. The compressing component is sleeved on an outer periphery of the mounting section and located in the adjustment space. The adjusting component is connected with the support component. A portion of the adjusting component is located in the adjustment space and squeezes the compressing component to deform to lock the mounting section and the supporting component. The adjusting component is configured to adjust a degree of compression of the compressing component at different positions in a circumferential direction of the mounting hole to adjust levelness and/or a centerline angle of the supporting component.

In some embodiments, the compressing component includes an inner expansion sleeve and an outer expansion sleeve that are nested with each other, the adjusting component squeezes the inner expansion sleeve to compress the inner expansion sleeve and the outer expansion sleeve against each other to deform, the inner expansion sleeve is configured to swing relative to the outer expansion sleeve when being squeezed, and when the adjustment component is pressed against the inner expansion sleeve, the inner expansion sleeve and the outer expansion sleeve are pressed against each other to cause deformation.

In some embodiments, the outer peripheral wall of the inner expansion sleeve includes a first bevel surrounding in a circumferential direction, and a distance between the bevel and an axis of the inner expansion sleeve decreases from top to bottom; the inner peripheral wall of the outer expansion sleeve includes a second bevel surrounding in the circumferential direction, and the second bevel and the first bevel are cooperated such that the inner expansion sleeve swings relative to the outer expansion sleeve when being squeezed.

In some embodiments, the second bevel and the first bevel are in line contact.

In some embodiments, the second bevel is an arc convex surface; and the first bevel is a flat surface.

In some embodiments, the inner peripheral wall of the outer expansion sleeve further includes a third bevel surrounding in the circumferential direction, the third bevel is located above the second bevel and is connected with the second bevel to form a continuous surface; and a distance between the third bevel and the axis of the outer expansion sleeve decreases from top to bottom, and when the inner expansion sleeve and the outer expansion sleeve are in an original state, the third bevel and the first bevel do not contact.

In some embodiments, the adjusting component includes a pressing sleeve and an adjustment member, the pressing sleeve is sleeved on the mounting section, and the bottom of the pressing sleeve extends into the adjustment space for squeezing the inner expansion sleeve; the top periphery of the pressing sleeve is an annular boss, and the annular boss is located above the supporting component; and a plurality of adjustment members are distributed around the mounting section along a circumference of the mounting section, the bottom of each adjustment member passes through the annular boss from top to bottom and is connected with the supporting component, a relative position of each adjustment member and the supporting component in a vertical direction is selectively adjusted to adjust the compression degree of the compressing component at different positions in the circumferential direction of the mounting hole.

In some embodiments, each adjustment member includes a threaded connection rod and a pressing block, the pressing block is pressed against the annular boss; one end of the threaded connection rod is integrated with the pressing block, and the other end of the threaded connection rod passes through the annular boss from top to bottom and is threadedly connected with the supporting component.

In some embodiments, among the plurality of adjustment members, at least one adjustment member is arranged in an extension direction of the supporting component, and at least one adjustment member is disposed on both sides of the extension direction of the supporting component.

In some embodiments, the supporting component includes an adapter block, a cross beam, and a bracket, the adapter block is provided with the mounting hole; one end of the cross beam is used as the first end of the supporting component and is fixedly connected with the adapter block, and the other end of the cross beam is arranged to extend along the radial direction of the lifting shaft; the bracket is disposed on the beam for supporting the wafer.

Another aspect of the present disclosure provides a semiconductor process device. The semiconductor process device includes a vacuum transfer chamber, a front-end chamber, and a loading chamber. The loading chamber is disposed between the vacuum transfer chamber and the front-end chamber, and the disclosed wafer support structure is disposed in the loading chamber.

The technical solution of the present disclosure provides the following beneficial effects.

The embodiments of the present disclosure at least provide the following beneficial effects. In the embodiments of the present disclosure, the mounting hole on the first end of the support component is sleeved on the mounting section of the lifting shaft. The inner peripheral wall of the mounting hole and the outer peripheral wall of the mounting section are separated by the adjustment space. The compressing component is sleeved on the outer periphery of the mounting section and is located in the adjustment space. The adjusting component is connected with the supporting component. A portion of the adjusting component is located in the adjustment space, and squeezes the compressing component to deform, such that fine adjustment of the attitude of the supporting component can be achieved to lock the mounting section and the supporting component. At the same time, the adjustment component is configured to adjust the degree of compression of the compressing component at different positions in the circumferential direction of the mounting hole to adjust the levelness and/or the centerline angle of the supporting component. In the embodiments of the present disclosure, the leveling of the attitude of the supporting component can be quickly achieved, thereby significantly reducing the cost of assembly and maintenance. In addition, because the supporting component is ensured to be leveled, the risk of slips and breaks during the wafer transfer process can be substantially reduced, and the transfer efficiency of the embodiments of the present disclosure can be substantially improved.

Additional aspects and advantages of the present disclosure will be set forth in part in the description which follows, and will be obvious from the description, or may be learned by practice of the present disclosure.

BRIEF DESCRIPTION OF THE DRAWINGS

The above and/or additional aspects and advantages of the present disclosure will become apparent and readily understood from the following description of the embodiments in conjunction with the accompanying drawings.

DETAILED DESCRIPTION OF THE EMBODIMENTS

Figure 1A:
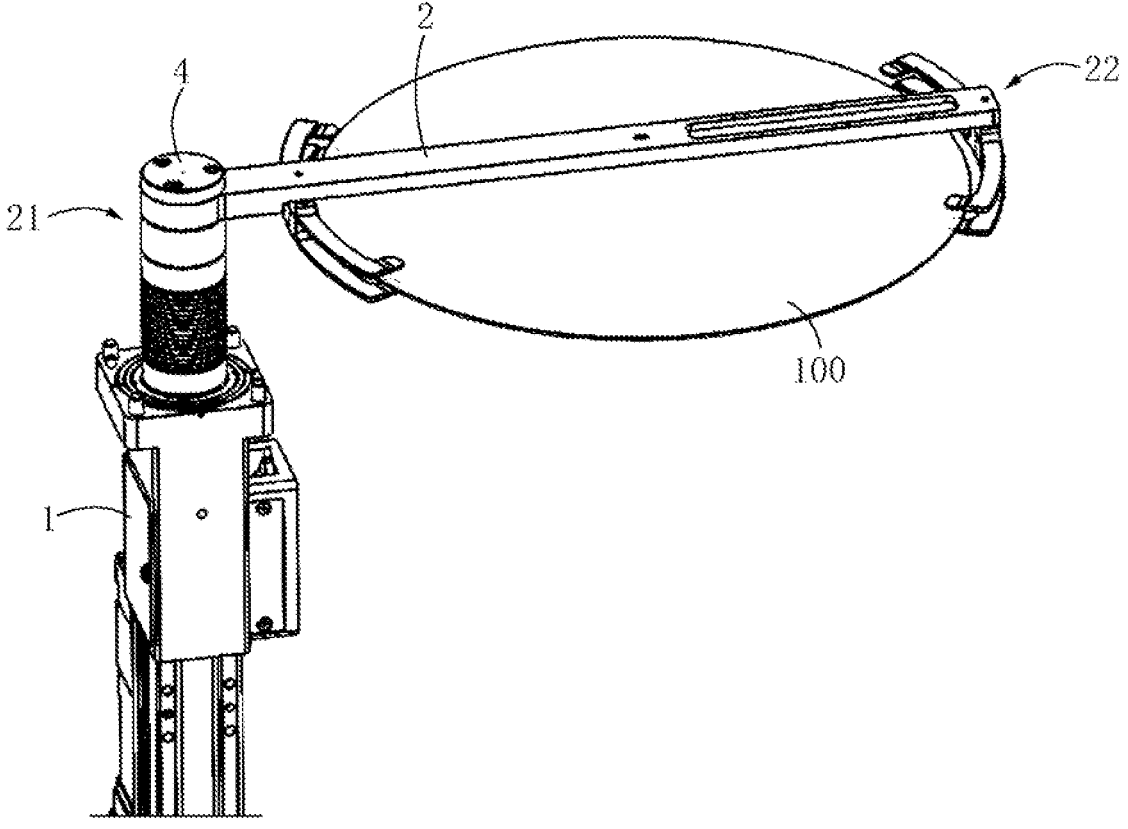
FIG. 1A is a structural diagram of a wafer support structure according to some embodiments of the present disclosure.

The present disclosure is described in detail below, and examples of embodiments of the present disclosure are shown in the accompanying drawings. Same or similar reference numerals throughout represent same or similar components or components with same or similar functions. Further, detailed descriptions of known technologies are omitted if they are unnecessary to illustrate the features of the present disclosure. The embodiments described below with reference to the drawings are exemplary and are only used to illustrate the present application and should be construed as limiting the present disclosure.

It will be understood by those skilled in the art that, unless otherwise defined, all terms (including technical terms and scientific terms) used herein have the same meanings as commonly understood by one of ordinary skill in the art to which the present disclosure pertains. It should also be understood that terms, such as those defined in general dictionaries, are to be understood to have meanings consistent with their meaning in the context of the prior art, and are not to be used in an unrealistic or overly descriptive manner unless specifically defined as herein to express a certain meaning.

The technical solution of the present disclosure and how the technical solution of the present disclosure solves the above technical problems will be described in detail below with various embodiments.

Figure 1B:
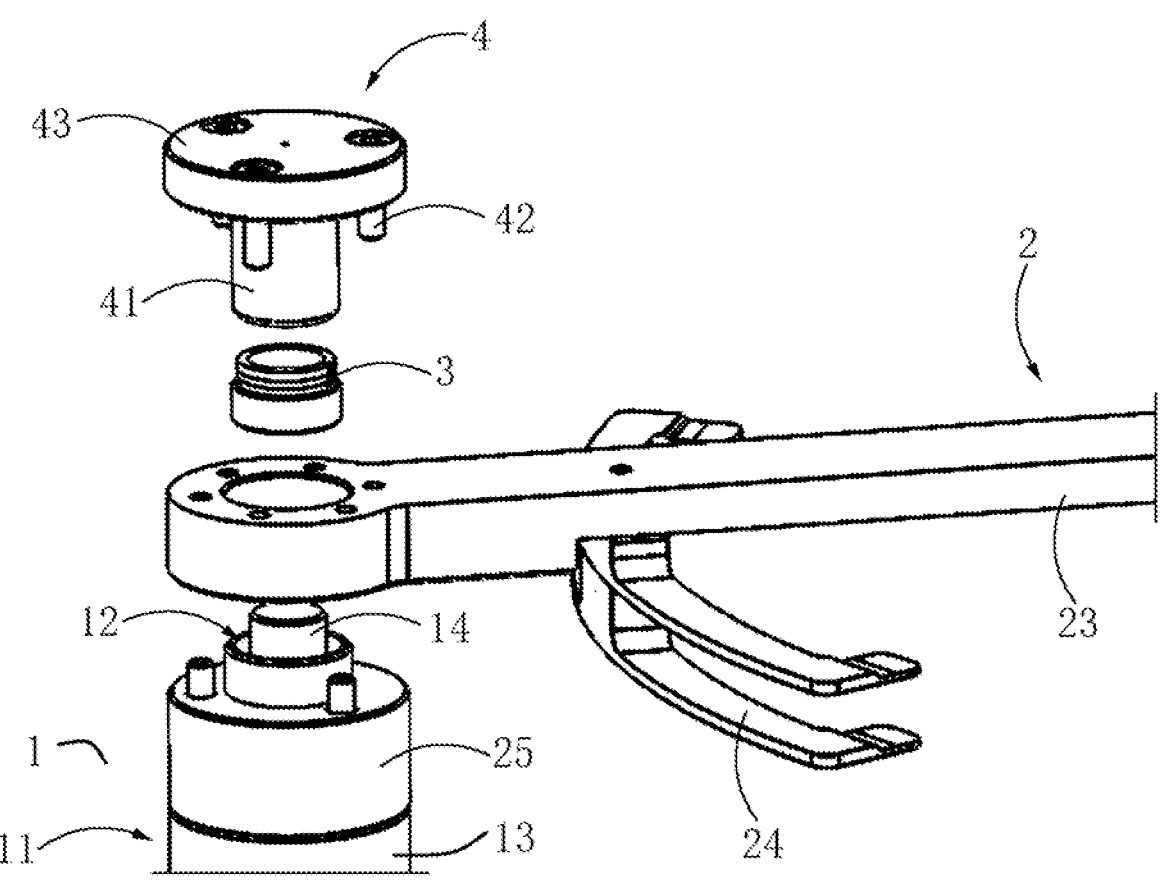
FIG. 1B is an exploded view of a wafer support structure according to some embodiments of the present disclosure.

The present disclosure provides a wafer support structure, which is provided in a loading chamber of a semiconductor process device and is used to support a wafer and drive the wafer up and down, such as moving the wafer to a cooling plate in the loading chamber, where cooling is performed on the wafer. Structural diagrams of the wafer support structure are shown in FIG. 1A and FIG. 1B. The wafer support structure includes: a lifting component 1, a supporting component 2, a compressing component 3, and an adjusting component 4. The lifting component 1 is provided in the loading chamber (not shown). The lifting component 1 includes a lifting shaft 11. The top surface of the lifting shaft 11 is provided with a mounting section 14. The supporting component 2 includes a first end 21 provided with a mounting hole 12 that is sleeved on a mounting section 14. The inner peripheral wall of the mounting hole 12 and an outer peripheral wall of the lifting shaft 11 are separated by an adjustment space. The supporting component 2 includes a second end 22 that extends along a radial direction of the lifting shaft 11. The lifting shaft 11 is used to drive the supporting component 2 to ascend and descend in a vertical direction. The compressing component 3 is sleeved on an outer periphery of the mounting section 14 located at the top of the lifting shaft 11 and is located in the adjustment space. The adjusting component 4 is provided on the top of the lifting shaft 11 and the first end 21, and is connected with the supporting component 2. A portion of the adjusting component 4 is located in the adjustment space, and squeezes the compressing component 3 to deform to lock the mounting section 14 and the supporting component 2 together. The adjusting component 4 is configured to be able to adjust a degree of compression of the compressing component 3 at different positions in a circumferential direction of the mounting hole 12, such that a levelness and/or a centerline angle of the supporting component 2 can be adjusted. That is, the attitude of the supporting component 2 can be adjusted. Thus, the supporting component 2 is leveled.

As shown in FIG. 1A and FIG. 1B, the semiconductor process device may be a device used to perform processes such as atomic layer deposition, dry cleaning, and plasma enhanced atomic layer deposition. However, the embodiments of the present disclosure are not limited thereto. Technicians may make adjustments themselves according to actual conditions. The lifting component 1 may be disposed in the loading chamber (not shown) and may be located at one side of the cooling plate (not shown). The lifting shaft 11 of the lifting component 1 may ascend and descend in the vertical direction. The top surface of the lifting shaft 11 is provided with the mounting section 14. The first end 21 of the supporting component 2 is provided with the mounting hole 12 that is sleeved on the mounting section 14. The inner peripheral wall of the mounting hole 12 and the outer peripheral wall of the lifting shaft 11 are separated by the adjustment space. For example, the inner peripheral wall of the mounting hole 12 is in clearance fit with the outer peripheral wall of the lifting shaft 11. The second end 22 of the supporting component 2 may be extended along the radial direction of the lifting shaft 11. That is, the supporting component 2 is disposed horizontally above the cooling plate. The supporting component 2 is used to support the wafer 100. The supporting component 2 may be driven by the lifting shaft 11 to ascend and descend, such that the wafer 100 can be lowered and placed on the cooling plate. Because the supporting component 2 is extended and arranged directly above the cooling plate, a central beam bracket often used in the prior art may be avoided to occupy a cooling plate space, resulting in uneven cooling of the wafer, and the need for needles in a central beam in the prior art may also be avoided to affect wafer production yield. The compressing component 3 may be sleeved on an outer circumference of the mounting section 14 and may be located in the adjustment space. The inner peripheral wall of the compressing component 3 may be arranged in close contact with the outer peripheral wall of the mounting section 14. The outer peripheral wall of the compressing component 3 may be arranged in close contact with the inner peripheral wall of the mounting hole 12. The adjusting component 4 may be disposed on the top of the lifting shaft 11 and the first end 21, and is connected with the supporting component 2. A portion of the adjusting component 4, that is, the bottom portion of the adjusting component 4 located in the adjustment space, may squeeze the compressing component 3 to deform to simultaneously lock the adjusting component 4, the supporting component 2, and the lifting shaft 11. In practical applications, while the adjusting component 4 is connected with the supporting component 2, the degree of compression of the compressing component 3 at different positions in the circumferential direction of the mounting hole 12 may be adjusted to adjust the attitude of the supporting component 2. For example, an extension direction of the supporting component 2 may be adjusted to the horizontal direction, and the centerline angle of the supporting component 2, that is, an angle of the centerline of the supporting component 2 in the circumferential direction of the lifting shaft 11 may also be adjusted.

In the embodiments of the present disclosure, the mounting hole 12 on the first end 21 of the supporting component 2 is sleeved on the mounting section 14 of the lifting shaft 11. The inner peripheral wall of the mounting hole 12 and the outer peripheral wall of the mounting section 14 are separated by the adjustment space. The compressing component 3 is sleeved on the outer peripheral wall of the mounting section 14 and is located in the adjustment space. The adjusting component 4 is connected with the support component 2. A portion of the adjusting component 4 is located in the adjustment space and squeezes the compressing component 3 to deform. The attitude of the supporting component 2 may be fine-tuned to lock the mounting section 14 and the supporting component 2. At the same time, the adjusting component 4 is configured to adjust the degree of compression of the compressing component 3 at different positions in the circumferential direction of the mounting hole 12 to adjust the levelness and/or the centerline angle of the supporting component 2. In the embodiments of the present disclosure, the attitude of the supporting component 2 may be quickly leveled, thereby significantly reducing the cost of assembly and maintenance. In addition, because the supporting component 2 is ensured to be leveled, the risk of slips and breaks during the wafer transfer process can be substantially reduced, thereby substantially improving transfer efficiency.

It should be noted that the embodiments of the present disclosure do not limit specific application scenarios of the wafer support structure. For example, the wafer support structure may also be disposed in other locations and does not necessarily have to be disposed in the loading chamber. Therefore, the embodiments of the present disclosure are not limited thereto, and those skilled in the art can make adjustments by themselves according to the actual situations.

In some embodiments, as shown in FIGS. 1A to 2C, the compressing component 3 includes an inner expansion sleeve 31 and an outer expansion sleeve 32 that are nested with each other. The adjusting component 4 squeezes the inner expansion sleeve 31 to make the inner expansion sleeve 31 and the outer expansion sleeve 32 press against each other to deform. The inner expansion sleeve 31 is configured to rotate around its axis relative to the outer expansion sleeve 32 when being squeezed.

As shown in FIGS. 1A to 2C, both the inner expansion sleeve 31 and the outer expansion sleeve 32 adopt a sleeve structure including a notch 33 on the peripheral wall extending in the axial direction, respectively. The inner expansion sleeve 31 is nested inside the outer expansion sleeve 32. The top of the inner expansion sleeve 31 is exposed to the top of the outer expansion sleeve 32 under a normal condition. In actual applications, when the adjusting component 4 pushes down the inner expansion sleeve 31, the inner expansion sleeve 31 and the outer expansion sleeve 32 may deform at the same time due to the existence of the notch 33. That is, an outer diameter of the outer expansion sleeve 32 increases, and an outer diameter of the inner expansion sleeve 31 decreases, thereby achieving locking of the supporting component 2 and the mounting section 14. Further, the inner expansion sleeve 31 may swing within the outer expansion sleeve 32. That is, an axis of the inner expansion sleeve 31 may tilt in any direction relative to an axis of the outer expansion sleeve 32. As shown in FIG. 2A and FIG. 2B, the supporting component 2 may swing relative to the mounting section 14 due to the above-described design of the compression component 3, thereby achieving levelness adjustment of the supporting component 2. In the embodiments of the present disclosure, the design of the compression component 3 application not only has a simple structure, but also facilitates adjustment of the supporting component 2, thereby substantially improving an efficiency of assembly and maintenance.

It should be noted that the embodiments of the present disclosure do not limit specific implementation of the compression component 3. For example, the inner expansion sleeve 31 may be nested at the bottom of the outer expansion sleeve 32, and the adjusting component 4 is used to squeeze the outer expansion sleeve 32. Thus, the embodiments of the present application are not limited thereto, and those skilled in the art may make adjustments by themselves according to the actual situations.

In some embodiments, as shown in FIGS. 1A to 2C, the inner peripheral wall of the inner expansion sleeve 31 is arranged in close contact with the outer peripheral wall of the mounting section 14, and the outer peripheral wall of the outer expansion sleeve 32 is arranged in close contact with the inner peripheral wall of the mounting hole 12. In some embodiments, the outer peripheral wall of the inner expansion sleeve 31 includes a first bevel 311 surrounding its circumference, and a distance between the first bevel 311 and the axis of the inner expansion sleeve 31 decreases from top to bottom. The inner peripheral wall of the expansion sleeve 32 includes a second bevel surrounding its circumference. The second bevel cooperates with the first bevel 311 such that the inner expansion sleeve 31 can swing relative to the outer expansion sleeve 32 when being squeezed.

As shown in FIGS. 1A to 2C, the inner peripheral wall of the inner expansion sleeve 31 is a cylindrical structure and is used to be sleeved on the mounting section 14. The inner peripheral wall of the inner expansion sleeve 31 is arranged in close contact with the outer peripheral wall of the mounting section 14. The top of the inner expansion sleeve 31 is a cylindrical structure. The bottom the inner expansion sleeve 31 is an inverted cone-shaped truncated cone structure. That is, the outer peripheral wall of the inner expansion sleeve 31 is formed with the first bevel 311. The first bevel 311 is configured to make both the inner expansion sleeve 31 and the outer expansion sleeve 32 deform when being pressed against each other. The outer expansion sleeve 32 overall is a cylindrical structure, and the outer expansion sleeve 32 is nested in the mounting hole 12 such that the outer peripheral wall of the outer expansion sleeve 32 and the inner peripheral wall of the mounting hole 12 are arranged in close contact. The inner peripheral wall of the outer expansion sleeve 32 includes the second bevel surrounding its circumference. The second bevel includes, for example, a third bevel 321. The third bevel 321 is located at the top of the inner peripheral wall of the outer expansion sleeve 32 such that the top of the inner peripheral wall of the outer expansion sleeve 32 is funnel-shaped. The third bevel 321 of the outer expansion sleeve 32 and the first bevel 311 of the inner expansion sleeve 31 are cooperated to guide the inner expansion sleeve 31 into the outer expansion sleeve 32.

In some embodiments, the second bevel and the first bevel 311 are in line contact. The above-described design makes the outer peripheral wall of the inner expansion sleeve 31 and the inner peripheral wall of the outer expansion sleeve 32 in line contact to reduce resistance between the two, thereby achieving the swing of the inner expansion sleeve 31 relative to the outer expansion sleeve 32. Thus, the inner expansion sleeve 31 and the outer expansion sleeve 32 are deformed more to expand applicability and scope of the present disclosure.

To achieve the line contact between the second bevel and the first bevel 311, the first bevel 311 may be, for example, a flat surface.

To achieve the line contact between the second bevel and the first bevel 311, the second bevel may be various structures. For example, as shown in FIGS. 1A to 2C, the second bevel includes an arc convex surface 322. The arc convex surface 322 is an annular surface. That is, the arc convex surface 322 is arranged to extend circumferentially along the inner peripheral wall of the outer expansion sleeve 32. The arc convex surface 322 is an arc surface structure that protrudes inward (i.e., close to the axis of the outer expansion sleeve 32). The arc convex surface 322 and the outer peripheral wall of the inner expansion sleeve 31 are in line contact.

In some embodiments, the inner peripheral wall of the outer expansion sleeve 32 not only includes the second bevel, but also includes the third bevel 321 surrounding its circumference. The third bevel 321 is located above the second bevel (i.e., the arc convex surface 322) and connected with the second bevel (i.e., the arc convex surface 322) to form a continuous surface. A distance between the third bevel and the axis of the outer expansion sleeve 32 decreases from top to bottom. When the inner expansion sleeve 31 and the outer expansion sleeve 32 are in an original state, the third bevel 321 does not contact the first bevel 311.

Figure 2A:
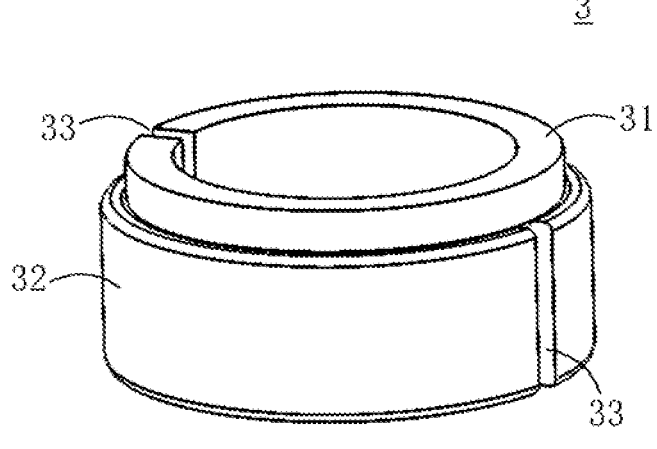
FIG. 2A is a structural diagram of a compressing component according to some embodiments of the present disclosure.
Figure 2B:
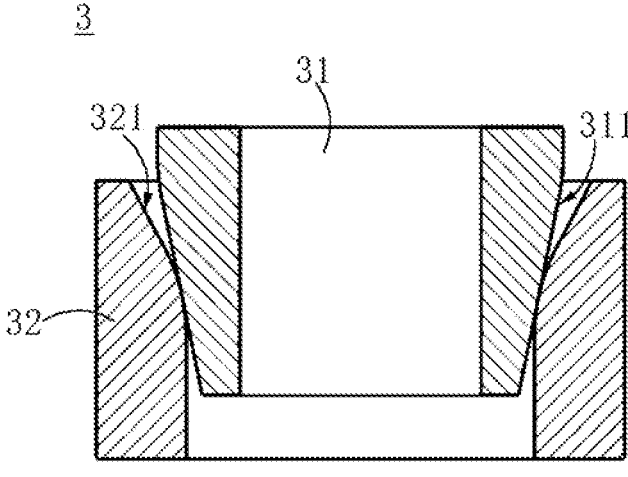
FIG. 2B is a cross-sectional view of a compressing component according to some embodiments of the present disclosure.
Figure 2C:
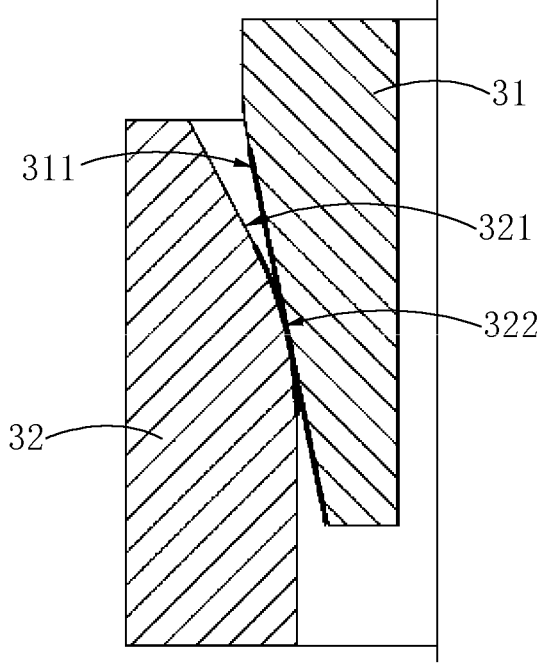
FIG. 2C is a partially enlarged cross-sectional view of a compressing component according to some embodiments of the present disclosure.

Specifically, the third bevel 321 is located at the top of the inner peripheral wall of the outer expansion sleeve 32, such that the top of the inner peripheral wall of the outer expansion sleeve 32 is funnel-shaped. The third bevel 321 of the outer expansion sleeve 32 and the first bevel 311 of the inner expansion sleeve 31 are cooperated to guide the inner expansion sleeve. 31 into the outer expansion sleeve 32. The third bevel 321 and the arc convex surface 322 are both annular surfaces, that is, being arranged to extend circumferentially along the inner peripheral wall of the outer expansion sleeve 32. The arc convex surface 322 is located at the bottom of the third bevel 321 and is connected with the third bevel 321. Specifically, the third bevel 321 and the arc convex surface 322 both extend circumferentially along the inner peripheral wall of the outer expansion sleeve 32. As shown in FIG. 2C, the top of the arc convex surface 322 is connected with the bottom of the third bevel 321. The connection between the two is a smooth transition. That is, the third bevel 321 is located at the top of the inner peripheral wall, and the arc convex surface 322 is located at the bottom of the third bevel 321. The inner peripheral wall at the bottom of the arc convex surface 322 extends along an axial direction of the outer expansion sleeve 32. The third bevel 321 and the axially extending inner peripheral wall are connected by the arc convex surface 322. That is, the arc convex surface 322 is located at the bottom of the third bevel 321, and the arc convex surface 322 is an arc surface structure protruding toward the axis of the outer expansion sleeve 32. In practical applications, the first bevel 311 of the inner expansion sleeve 31 contacts the arc convex surface 322 to achieve the line contact between the two, such that the inner expansion sleeve 31 can swing relative to the outer expansion sleeve 32. The above-described design achieves the swing of the inner expansion sleeve 31 relative to the outer expansion sleeve 32 using a relatively simple structure, which not only significantly reduces application and maintenance costs, but also reduces the failure rate and extends the service life.

It should be noted that the embodiments of the present application do not limit the specific structures of the outer peripheral wall of the inner expansion sleeve 31 and the inner peripheral wall of the outer expansion sleeve 32. For example, the entire outer peripheral wall of the inner expansion sleeve 31 may be a bevel structure, and the entire inner peripheral wall of the outer expansion sleeve 32 may also be a bevel structure. Thus, the embodiments of the present disclosure are not limited thereto, and those skilled in the art can make adjustments by themselves according to the actual situations.

It should also be noted that the embodiments of the present application do not limit the specific structures of the second bevel and the first bevel. For example, the second bevel may also be a convex ring formed on the inner peripheral wall, and the cross-sectional shape of the convex ring is a semicircular structure. This design of the second bevel may also achieve the line contact with the first bevel. In addition, the first inclined surface may also be a structure other than a flat surface, such as a circular arc convex surface. Thus, the embodiments of the present disclosure are not limited thereto, and those skilled in the art can make adjustments by themselves according to the actual situations.

Figure 3:
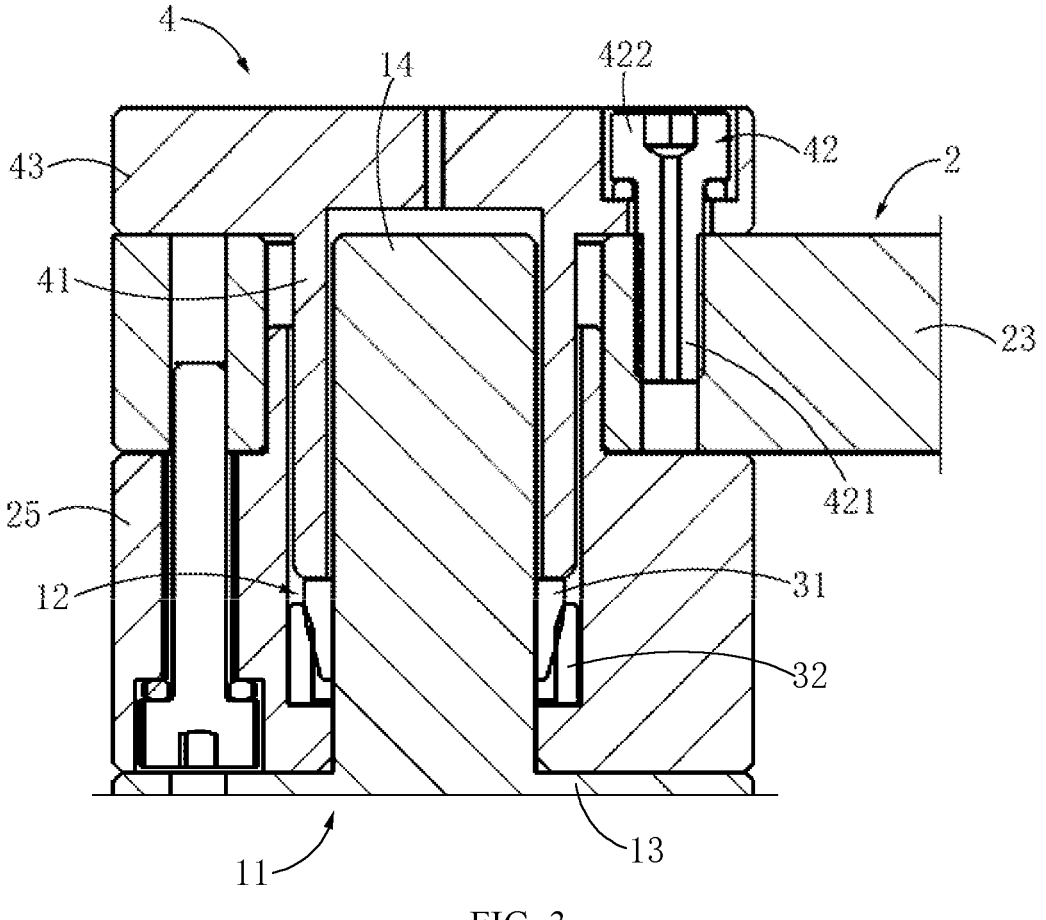
FIG. 3 is a partially enlarged cross-sectional view of a wafer support structure according to some embodiments of the present disclosure.

In some embodiments, as shown in FIGS. 1A, 1B, and 3, the adjusting component 4 includes a pressing sleeve 41 and an adjustment member 42. The pressing sleeve 41 is sleeved on the mounting section 14. The bottom of the pressing sleeve 41 extends into the adjustment space for squeezing the inner expansion sleeve 31. The top periphery of the pressing sleeve 41 is an annular boss 43. The annular boss 43 is located above the supporting component 2. A plurality of adjustment members 42 are distributed around the mounting section 14 along the circumference of the mounting section 14. The bottom of each adjustment member 42 passes through the annular boss 43 from top to bottom and is connected to the supporting component 2. The position of each adjustment member 42 relative to the supporting component 2 in the vertical direction may be selectively adjusted to adjust the degree of compression of the compressing component 3 at different positions in the circumferential direction of the mounting hole 12, such that the attitude of the supporting component 2 can be adjusted to level the supporting component 2.

Specifically, the pressing sleeve 41 is sleeved on the mounting section 14. The annular boss 43 is integrally formed on the top periphery of the pressing sleeve 41. A plurality of through holes are formed on the annular boss 43 to accommodate the plurality of adjustment members 42 inside in one-to-one correspondence. The bottom of the pressing sleeve 41 extends into the adjustment space. The bottom of the pressing sleeve 41 may push against the top of the inner expansion sleeve 31. The plurality of adjustment members 42 may be arranged along the circumference of the annular boss 43, are respectively inserted into the plurality of through holes of the annular boss 43, and are connected with the supporting component 2. In actual applications, the plurality of adjustment members 42 may gradually press the pressing sleeve 41 downward. The inner expansion sleeve 31 gradually enters the outer expansion sleeve 32 under the pressure. By adjusting a pressing depth of the plurality of adjustment members 42, the supporting component 2 may be pushed or pulled to achieve leveling of the attitude of the supporting component 2. After the leveling is completed, the plurality of adjustment members 42 may be adjusted to a same pressing depth to achieve the compression of the supporting component 2 to the compression component 3. Due to the action of the compression component 3, the supporting component 2 and the lifting shaft 11 are also locked. The above-described design makes adjustment of the embodiments of the present disclosure simple and easy to implement, and is highly stable, thereby substantially improving work efficiency.

In some embodiments, as shown in FIGS. 1A, 1B, and 3, each adjustment member 42 includes a threaded connection rod 421 and a pressing block 422. The pressing block 422 presses against the annular boss 43. One end of the threaded connection rod 421 is integrated with the pressing block 422, and the other end of the threaded connection rod 421 passes through the annular boss 43 from top to bottom and is threadedly connected with the supporting component 2.

As shown in FIG. 1A, FIG. 1B and FIG. 3, each adjustment member 42 may be a bolt, in which the threaded connection rod 421 is the screw part, and the pressing block 422 is the nut part. In actual applications, the threaded connection rod 421 slides through the through hole. The bottom thereof is threadedly connected with the supporting component 2. The pressing block 422 is located on the annular boss 43. By operating the pressing block 422, the threaded connection rod 421 is screwed into the supporting component 2 such that the plurality of adjustment members 42 can pull the supporting component 2 to level the attitude of the supporting component 2. For example, by operating the adjustment member 42 close to the supporting component 2, the position of the supporting component 2 corresponding to the adjustment member 42 may be brought closer to the annular boss 43, thereby raising the side of the supporting component 2 corresponding to the adjustment member 42. The above-described design not only can effectively reduce the application and maintenance costs of the embodiments of the present disclosure, but also can further improve the adjustment efficiency.

In some embodiments, as shown in FIGS. 1A, 1B and 3, among the plurality of adjustment members 42, at least one adjustment member 42 is arranged in the extension direction of the supporting component 2, and at least one adjustment member 42 is disposed on both sides of the extension direction of the support component 2. Specifically, taking three adjustment members 42 as an example. The three adjustment members 42 are evenly and separately arranged on the annular boss 43. At least one adjustment member 42 is located in the extension direction of the supporting component 2, and the other two adjustment members 42 are respectively located on both sides of the extension direction of the supporting component 2. In practical applications, by adjusting the adjustment member 42 in an axial direction of the supporting component 2, the extension direction of the supporting component 2 may be adjusted to the horizontal direction. By adjusting the adjustment members on both sides of the extension direction of the supporting component 2, the supporting component 2 may be prevented from being tilted toward either side of the centerline. The centerline is the extension direction. Thus, the overall attitude of the supporting component 2 is in a leveled state to further avoid the occurrence of wafer slides and breaks. The above-described design not only can substantially improve the stability of the embodiments of the present disclosure, but also can further improve the flexibility of adjustment. It should be noted that the embodiments of the present application do not limit the specific number and arrangement of the adjustment members 42, and those skilled in the art can make adjustments by themselves according to the actual situations.

In some embodiments, as shown in FIG. 1A, FIG. 1B, and FIG. 3, the supporting component 2 includes a cross beam 23, a bracket 24, and an adapter block 25. The adapter block 25 is provided with the mounting hole 12. The mounting hole 12 is sleeved on the mounting section 14 on the top of the lifting shaft 11. One end of the cross beam 23 (i.e., the first end 21 of the supporting component 2) is fixedly connected with the adapter block 25. It is sleeved on the adapter block 25 and connected with the adapter block 25. The inner peripheral wall of the adapter block 25 and the outer peripheral wall of the lifting shaft 11 are matched to form the adjustment space. The other end of the cross beam 23 (i.e., the second end 22 of the supporting component 2) is arranged to extend along the radial direction of the lifting shaft 11. The bracket 24 is disposed on the cross beam 23 for supporting the wafer. Specifically, the adapter block 25 is provided with the mounting hole 12. The mounting hole 12 is sleeved on the mounting section 14 on the top of the lifting shaft 11. The adapter block 25 is a cylindrical structure made of metal material. The mounting hole 12, for example, is provided at a center position on the top of the adapter block 25 to be separated from the outer peripheral wall of the mounting section 14 to form the adjustment space. The cross beam 23 may be a rod-shaped structure made of metal. One end of the cross beam 23 (i.e., the first end 21 of the supporting component 2) is sleeved on the adapter block 25. The adapter block 25 may be fixedly connected with the one end of the cross beam 23 using multiple fasteners. Then, both the cross beam 23 and the adapter block 25 are sleeved on the lifting shaft 11. Because the adapter block 25 raises the height of the cross beam 23, the length of the pressing sleeve 41 is extended, thereby providing space for adjusting the levelness of the cross beam 23. In addition, the provision of the adapter block 25 may also reduce the processing cost of the cross beam 23. The bracket 24 may include two oppositely arranged arc-shaped brackets. Accommodating grooves may be provided on the two arc-shaped brackets. The two arc-shaped brackets are both arranged at the bottom of the cross beam 23 to support two opposite edges of the wafer. The above-described design not only can substantially reduce the weight of the supporting component 2, but also can make the structure of the embodiments of the present disclosure simple and easy to implement, thereby significantly reducing application and maintenance costs.

It should be noted that the embodiments of the present disclosure do not limit the connection method between the adapter block 25 and the cross beam 23. For example, the two may be integrally formed or fixedly connected by welding. Thus, the embodiments of the present disclosure are not limited thereto, and those skilled in the art can make adjustments by themselves according to the actual situations.

As shown in FIGS. 1A, 1B, and 3, the lifting shaft 11 includes a body section 13 and the mounting section 14. The top of the body section 13 is provided with the mounting section 14. The diameter of the body section 13 is larger than the diameter of the mounting section 14. The mounting hole 12 on the adapter block 25 is sleeved on the mounting section 14 and is carried on the top of the body section 13. Specifically, the body section 13 is a cylindrical structure, with a cylindrical mounting section 14 at its top. The diameter of the mounting section 14 is smaller than the diameter of the body section 13, such that the mounting hole 12 on the adapter block 25 can be sleeved on the mounting section 14 and carried by the top of the body section 13, thereby facilitating assembly and maintenance. The sizes of the adapter block 25 and the compressing component 3 may be reduced, thereby substantially reducing the space occupied by the embodiment of the present disclosure. In some embodiments, the overall diameter of the lifting shaft 11 is relatively small. An annular flange is integrally formed near the top position for carrying the supporting component 2, which can also achieve the above technical effect. Thus, the embodiments of the present disclosure do not limit the specific structure of the lifting shaft 11, and those skilled in the art can make adjustments by themselves according to the actual situations.

To further illustrate the beneficial effects of the embodiments of the present disclosure, an adjustment process implemented in the present disclosure is described below with reference to FIGS. 1A to 4D. During an assembling process of the present disclosure, it is necessary to level the attitude of the supporting component 2, and generally the following situations may occur. In a first situation, the second end 22 of the supporting component 2 may descend or ascend. That is, an angle may be formed between an extension direction of the cross beam 23 and the horizontal direction of the cross beam 23. In a second situation, one end of the bracket 24 may descend or ascend. That is, the supporting component 2 deviates to the left or right with the extension direction of the cross beam 23 as the centerline. As shown in FIG. 4B, an upward direction of the cross beam 23 is to the left side, and a downward direction of the cross beam 23 is to the right side. For the convenience of description, the three adjustment members 42 are respectively defined as a first adjustment member 42a, a second adjustment member 42b, and a third adjustment member 42c. The first adjustment member 42a is located in the extending direction of the cross beam 23, and the second adjustment member 42b and the third adjustment member 42c are respectively located above and below the extension direction of the cross beam 23.

Figure 4A:
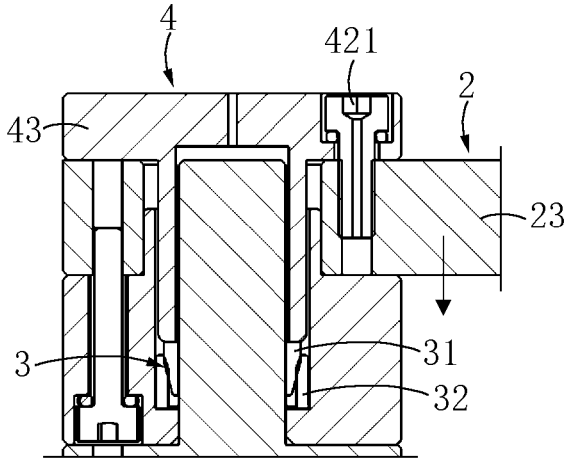
FIG. 4A is a partially enlarged cross-sectional view of a wafer support structure in a first state according to some embodiments of the present disclosure.
Figure 4B:
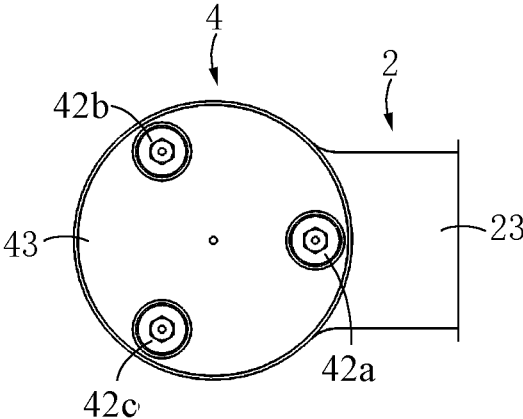
FIG. 4B is a partial top view of a wafer support structure in a first state according to some embodiments of the present disclosure.
Figure 4C:
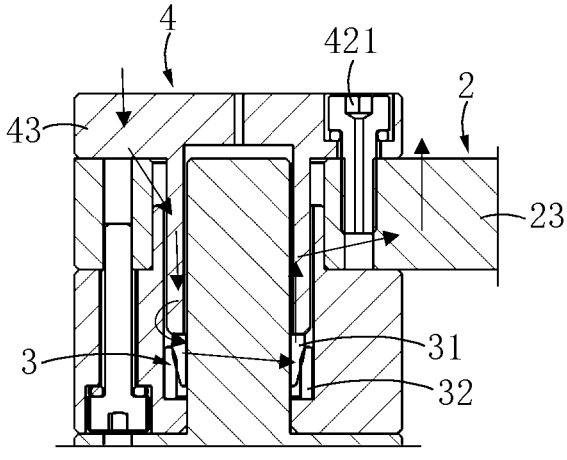
FIG. 4C is a partial cross-sectional view of a wafer support structure in a second state according to some embodiments of the present disclosure.
Figure 4D:
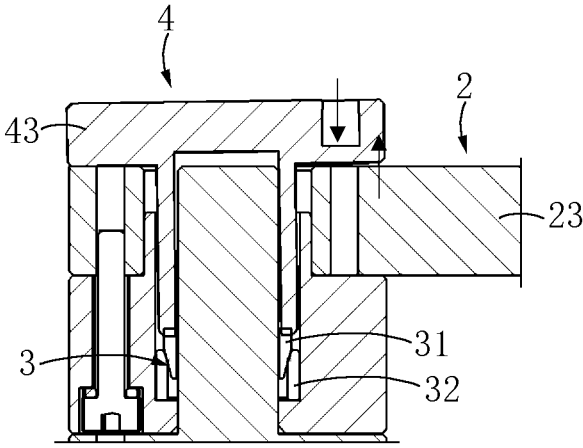
FIG. 4D is a cross-sectional view of a wafer support structure in a third state according to some embodiments of the present disclosure.

As shown in FIG. 4A, taking the first situation as an example for leveling, an electronic wafer needs to be placed on the bracket 24 throughout the adjustment process for real-time level monitoring. After the plurality of adjustment members 42 are pre-tightened, the compressing component 3 has been initially compressed. The entire mechanism is in a preliminary fixed state. By continuing to increase the torque of the first adjustment member 42a and the second adjustment member 42b, the compressing component 3 is fully compressed. In the process, the inner expansion sleeve 31 may swing to cause the left to be lower and the right to be higher. The adapter block 25 drives the right side of the cross beam 23 to ascend, such that the level of the cross beam 23 will be smoothed but the amplitude is small, as shown in FIG. 4C. Because the system is fully compressed, the torque of the first adjustment member 42*a* is increased again at this time. The cross beam 23 may be pulled by the first adjustment member 42*a* at this time, such that the extension direction of the cross beam 23 is quickly adjusted to move toward the horizontal direction. The levelness is digitally displayed by the electronic wafer. The leveling requirement may be eventually reached, as shown in FIG. 4D. Correspondingly, when the second end 22 of the cross beam 23 ascends, the adjustment is performed by pre-tightening the first adjustment member 42*a*, and then adjusting the second adjustment member 42*b* and the third adjustment member 42*c*. When the supporting component 2 deviates to the left with the extension direction of the cross beam 23 as the centerline, the adjustment is performed by pre-tightening the third adjustment member 42*c* and then adjusting the second adjustment member 42*b*. When the supporting component 2 deviates to the right with the extension direction of the cross beam 23 as the centerline, the adjustment is performed by pre-tightening the second adjustment member 42*b* and then adjusting the third adjustment member 42*c*. Of course, in the adjustment process, because the adjustment members 42 are arranged in a three-point positioning manner, the problem often cannot be solved by adjusting a certain adjustment member 42. It is also necessary to fine-tune the other adjustment members 42 and make coordinated adjustments to achieve the leveling.

Based on the same inventive concept, the present disclosure provides a semiconductor process device. The semiconductor process device includes a vacuum transfer chamber, a front-end chamber, and a loading chamber. The loading chamber is disposed between the vacuum transfer chamber and the front-end chamber. The wafer support structure provided in various embodiments is disposed in the loading chamber.

The embodiments of the present disclosure at least provide the following beneficial effects. In the embodiments of the present disclosure, the mounting hole on the first end of the support component is sleeved on the mounting section of the lifting shaft. The inner peripheral wall of the mounting hole and the outer peripheral wall of the mounting section are separated by the adjustment space. The compressing component is sleeved on the outer periphery of the mounting section and is located in the adjustment space. The adjusting component is connected with the supporting component. A portion of the adjusting component is located in the adjustment space, and squeezes the compressing component to deform, such that fine adjustment of the attitude of the supporting component can be achieved to lock the mounting section and the supporting component. At the same time, the adjustment component is configured to adjust the degree of compression of the compressing component at different positions in the circumferential direction of the mounting hole to adjust the levelness and/or the centerline angle of the supporting component. In the embodiments of the present disclosure, the leveling of the attitude of the supporting component can be quickly achieved, thereby significantly reducing the cost of assembly and maintenance. In addition, because the supporting component is ensured to be leveled, the risk of slips and breaks during the wafer transfer process can be substantially reduced, and the transfer efficiency of the embodiments of the present disclosure can be substantially improved.

It should be understood that the above-described embodiments are merely exemplary and are adopted to illustrate the principles of the present disclosure, but the present disclosure is not limited thereto. For those of ordinary skill in the art, various modifications and improvements can be made without departing from the spirit and essence of the present disclosure, and these modifications and improvements are also regarded as within the scope of the present disclosure.

In the description of the present disclosure, it should be understood that the orientations or positional relationships indicated by terms "center," "upper," "lower," "front," "rear," "left," "right," "vertical," "horizontal," "top," "bottom," "inner," "outer," etc. are based on the orientations or positional relationships shown in the drawings. They are merely for the convenience of describing the present disclosure and simplifying the description, are not intended to indicate or imply that the devices or elements referred to must have a specific orientation, be constructed and operate in a specific orientation, and therefore are not to be construed as limitations of the present disclosure.

The terms "first" and "second" are used for descriptive purposes only and shall not be understood as indicating or implying relative importance or implicitly indicating the quantity of indicated technical features. Therefore, features defined as "first" and "second" may explicitly or implicitly include one or more of these features. In the description of the present disclosure, unless otherwise specified, "plurality" means two or more.

In the description of the present disclosure, it should be noted that, unless otherwise clearly stated and limited, the terms "installation", "connected" and "connection" should be understood in a broad sense. For example, a connection may be a fixed connection, a detachable connection, or an integral connection. A connection may be directly connected, or indirectly connected through an intermediary, or it can be an internal connection between two components. For those of ordinary skill in the art, the specific meanings of the above terms in the present disclosure can be understood on a case-by-case basis.

In the description of the specification, specific features, structures, materials or characteristics may be combined in any suitable manner in any one or more embodiments or examples.

The above are merely some of the embodiments of the present disclosure. It should be pointed out that those of ordinary skill in the art may also make several improvements and modifications without departing from the principles of the present disclosure. These improvements and modifications should be regarded as within the scope of the present disclosure.

What is claimed is:

1. A wafer support structure disposed in a loading chamber of a semiconductor process device to support a wafer and drive the wafer to ascend or descend, comprising:
   a lifting component;
   a supporting component;
   a compressing component; and
   an adjusting component;
   wherein:
      the lifting component includes a lifting shaft, a mounting section is provided on a top surface of the lifting shaft; a first end of the supporting component is sleeved in a mounting hole of the mounting section; an inner peripheral wall of the mounting hole and an outer peripheral wall of the mounting section are separated by an adjustment space, a second end of the supporting component is arranged to extend along a radial direction of the lifting shaft;

15 the compressing component is sleeved on an outer periphery of the mounting section and located in the adjustment space; and the adjusting component is connected with the supporting component, a portion of the adjusting component is located in the adjustment space and is configured to squeeze the compressing component to deform to lock the mounting section and the supporting component; the adjusting component is configured to adjust a degree of compression of the compressing component at different positions in a circumferential direction of the mounting hole to adjust levelness and/or a centerline angle of the supporting component.

2. The wafer support structure according to claim 1, wherein:

the compressing component includes an inner expansion sleeve and an outer expansion sleeve that are nested with each other, the adjusting component is configured to squeeze the inner expansion sleeve to compress the inner expansion sleeve and the outer expansion sleeve against each other to deform, the inner expansion sleeve is configured to swing relative to the outer expansion sleeve when being squeezed, and when the adjustment component is pressed against the inner expansion sleeve, the inner expansion sleeve and the outer expansion sleeve are pressed against each other to cause deformation.

3. The wafer support structure according to claim 2, wherein:

an outer peripheral wall of the inner expansion sleeve includes a first bevel surrounding in a circumferential direction, and a distance between the bevel and an axis of the inner expansion sleeve decreases from top to bottom; an inner peripheral wall of the outer expansion sleeve includes a second bevel surrounding in the circumferential direction, and the second bevel and the first bevel are cooperated such that the inner expansion sleeve swings relative to the outer expansion sleeve when being squeezed.

4. The wafer support structure according to claim 3, wherein:

the second bevel and the first bevel are in line contact.

5. The wafer support structure according to claim 4, wherein:

the second bevel is an arc convex surface; and the first bevel is a flat surface.

6. The wafer support structure according to claim 5, wherein:

the inner peripheral wall of the outer expansion sleeve further includes a third bevel surrounding in the circumferential direction, the third bevel is located above the second bevel and is connected with the second bevel to form a continuous surface; and a distance between the third bevel and the axis of the outer expansion sleeve decreases from top to bottom, and when the inner expansion sleeve and the outer expansion sleeve are in an original state, the third bevel and the first bevel do not contact.

7. The wafer support structure according to claim 2, wherein:

the adjusting component includes a pressing sleeve and an adjustment member, the pressing sleeve is sleeved on adjustment member, the pressing sleeve is sleeved on the mounting section, and a bottom of the pressing sleeve extends into the adjustment space for squeezing the inner expansion sleeve;

16 a top periphery of the pressing sleeve is an annular boss, and the annular boss is located above the supporting component; and a plurality of the adjustment members are distributed around the mounting section along a circumference of the mounting section, a bottom of each of the adjustment members passes through the annular boss from top to bottom and is connected with the supporting component, a relative position of each of the adjustment members and the supporting component in a vertical direction is selectively adjusted to adjust the compression degree of the compressing component at different positions in the circumferential direction of the mounting hole.

8. The wafer support structure according to claim 7, wherein:

each of the adjustment members include a threaded connection rod and a pressing block, the pressing block is pressed against the annular boss; one end of the threaded connection rod is integrated with the pressing block, and the other end of the threaded connection rod passes through the annular boss from top to bottom and is threadedly connected with the supporting component.

9. The wafer support structure according to claim 7, wherein:

among the plurality of adjustment members, at least one adjustment member is arranged in an extension direction of the supporting component, and at least one adjustment member is disposed on each of both sides of the extension direction of the supporting component.

10. The wafer support structure according to claim 1, wherein:

the supporting component includes an adapter block, a cross beam, and a bracket, the adapter block is provided with the mounting hole; one end of the cross beam is used as the first end of the supporting component and is fixedly connected with the adapter block, and an other end of the cross beam is arranged to extend along the radial direction of the lifting shaft; the bracket is disposed on the cross beam for supporting the wafer.

11. A semiconductor process device, comprising:

a vacuum transfer chamber;

a front-end chamber; and a loading chamber;

wherein the loading chamber is disposed between the vacuum transfer chamber and the front-end chamber, and a wafer support structure disposed in the loading chamber includes:

a lifting component;

a supporting component;

a compressing component; and an adjusting component;

wherein:

the lifting component includes a lifting shaft, a mounting section is provided on a top surface of the lifting shaft; a first end of the supporting component is sleeved in a mounting hole of the mounting section; an inner peripheral wall of the mounting hole and an outer peripheral wall of the mounting section are separated by an adjustment space, a second end of the supporting component is arranged to extend along a radial direction of the lifting shaft;

the compressing component is sleeved on an outer periphery of the mounting section and located in the adjustment space; and the adjusting component is connected with the supporting component, a portion of the adjusting component is located in the adjustment space and is configured to squeeze the compressing component to deform to lock the mounting section and the supporting component; the adjusting component is configured to adjust a degree of compression of the compressing component at different positions in a circumferential direction of the mounting hole to adjust levelness and/or a centerline angle of the supporting component.

12. The semiconductor process device according to claim 11, wherein:

the compressing component includes an inner expansion sleeve and an outer expansion sleeve that are nested with each other, the adjusting component is configured to squeeze the inner expansion sleeve to compress the inner expansion sleeve and the outer expansion sleeve against each other to deform, the inner expansion sleeve is configured to swing relative to the outer expansion sleeve when being squeezed, and when the adjustment component is pressed against the inner expansion sleeve, the inner expansion sleeve and the outer expansion sleeve are pressed against each other to cause deformation.

13. The semiconductor process device according to claim 12, wherein:

an outer peripheral wall of the inner expansion sleeve includes a first bevel surrounding in a circumferential direction, and a distance between the bevel and an axis of the inner expansion sleeve decreases from top to bottom; an inner peripheral wall of the outer expansion sleeve includes a second bevel surrounding in the circumferential direction, and the second bevel and the first bevel are cooperated such that the inner expansion sleeve swings relative to the outer expansion sleeve when being squeezed.

14. The semiconductor process device according to claim 13, wherein:

the second bevel and the first bevel are in line contact.

15. The semiconductor process device according to claim 14, wherein:

the second bevel is an arc convex surface; and the first bevel is a flat surface.

16. The semiconductor process device according to claim 15, wherein:

the inner peripheral wall of the outer expansion sleeve further includes a third bevel surrounding in the circumferential direction, the third bevel is located above the second bevel and is connected with the second bevel to form a continuous surface; and a distance between the third bevel and the axis of the outer expansion sleeve decreases from top to bottom, and when the inner expansion sleeve and the outer expansion sleeve are in an original state, the third bevel and the first bevel do not contact.

17. The semiconductor process device according to claim 12, wherein:

the adjusting component includes a pressing sleeve and an adjustment member, the pressing sleeve is sleeved on the mounting section, and a bottom of the pressing sleeve extends into the adjustment space for squeezing the inner expansion sleeve; a top periphery of the pressing sleeve is an annular boss, and the annular boss is located above the supporting component; and a plurality of the adjustment members are distributed around the mounting section along a circumference of the mounting section, a bottom of each of the adjustment members passes through the annular boss from top to bottom and is connected with the supporting component, a relative position of each of the adjustment members and the supporting component in a vertical direction is selectively adjusted to adjust the compression degree of the compressing component at different positions in the circumferential direction of the mounting hole.

18. The semiconductor process device according to claim 17, wherein:

each of the adjustment members include a threaded connection rod and a pressing block, the pressing block is pressed against the annular boss; one end of the threaded connection rod is integrated with the pressing block, and the other end of the threaded connection rod passes through the annular boss from top to bottom and is threadedly connected with the supporting component.

19. The semiconductor process device according to claim 17, wherein:

among the plurality of adjustment members, at least one adjustment member is arranged in an extension direction of the supporting component, and at least one adjustment member is disposed on each of both sides of the extension direction of the supporting component.

20. The semiconductor process device according to claim 11, wherein:

the supporting component includes an adapter block, a cross beam, and a bracket, the adapter block is provided with the mounting hole; one end of the cross beam is used as the first end of the supporting component and is fixedly connected with the adapter block, and an other end of the cross beam is arranged to extend along the radial direction of the lifting shaft; the bracket is disposed on the cross beam for supporting the wafer.

* * * * *